United States Patent [19]

Ledda

[11] Patent Number: 5,596,614
[45] Date of Patent: Jan. 21, 1997

[54] METHOD AND CIRCUITRY FOR ALIGNING THE PHASE OF HIGH-SPEED CLOCKS IN TELECOMMUNICATIONS SYSTEMS

[75] Inventor: Francesco Ledda, Plano, Tex.

[73] Assignee: Alcatel Network Systems, Inc., Richardson, Tex.

[21] Appl. No.: 528,424

[22] Filed: Sep. 13, 1995

Related U.S. Application Data

[63] Continuation of Ser. No. 115,420, Aug. 31, 1993, abandoned.

[51] Int. Cl.$^6$ .................................................. H03D 3/24
[52] U.S. Cl. ........................ 375/376; 375/375; 331/1 A
[58] Field of Search ................................. 375/294, 375, 375/376; 307/269, 262; 328/63, 72, 155, 14; 331/1 A, DIG. 2, 25; 455/260

[56] References Cited

U.S. PATENT DOCUMENTS

| | | | |
|---|---|---|---|
| 4,369,515 | 1/1983 | Valdes | 375/108 |
| 4,418,318 | 11/1983 | Swagerty et al. | 375/120 |
| 4,577,163 | 3/1986 | Culp | 328/155 |
| 4,972,442 | 11/1990 | Steierman | 375/120 |
| 5,018,170 | 5/1991 | Wilson | 375/120 |
| 5,153,526 | 10/1992 | Hori et al. | 328/14 |
| 5,259,007 | 11/1993 | Yamamoto | 375/120 |
| 5,260,979 | 11/1993 | Parker | 375/120 |
| 5,291,528 | 3/1994 | Vermeer | 375/106 |
| 5,341,402 | 8/1994 | Matsushita et al. | 375/97 |

FOREIGN PATENT DOCUMENTS

| | | | |
|---|---|---|---|
| 0353616A1 | 2/1990 | European Pat. Off. | H04L 7/00 |
| 0536464A3 | 4/1993 | European Pat. Off. | H04J 3/06 |
| 0536464A2 | 4/1993 | European Pat. Off. | H04J 3/06 |
| 2005497A | 4/1979 | United Kingdom | H03B 3/04 |

OTHER PUBLICATIONS

Harro L. Hartman, and Erhard Steiner, "Synchronization Techniques for Digital Networks," *IEEE Journal on Selected Areas in Communications*, vol. SAC-4, No. 4, Jul., 1986, pp. 506–513.

*Primary Examiner*—Stephen Chin
*Assistant Examiner*—T. Ghebretinsae
*Attorney, Agent, or Firm*—Baker & Botts, L.L.P.

[57] ABSTRACT

A method and circuitry are provided for detecting and measuring a phase difference between the output signals from a primary stratum clock and a standby stratum clock in a telecommunications system, computing a period of time needed for a numerically-controlled oscillator to shift the frequency of the standby clock enough to cancel the phase difference, transforming the required period of time into a signal representing a corresponding number of frequency shift steps, and controlling the numerically-controlled oscillator with the step signal to shift the frequency of the standby clock accordingly and thereby cancel the phase difference. Both the frequency and phase alignments of the two clocks are thus maintained. Therefore, when either the system or user switches operations from the primary stratum clock module to the standby stratum clock module, phase-related transients are not generated, which results in a significant increase in the overall performance and reliability of the system.

4 Claims, 1 Drawing Sheet

METHOD AND CIRCUITRY FOR ALIGNING THE PHASE OF HIGH-SPEED CLOCKS IN TELECOMMUNICATIONS SYSTEMS

CROSS REFERENCE TO RELATED APPLICATIONS

This application is a continuation of application Ser. No. 08/115,420 filed Aug. 31, 1993, entitled "Method and Circuitry for Aligning the Phase of High-Speed Clocks in Telecommunications Systems," by Francesco Ledda, now abandoned.

TECHNICAL FIELD OF THE INVENTION

The present invention is concerned generally with high-speed telecommunications systems, and more specifically with techniques for improving the operability and reliability of high-speed telecommunications systems. Even more specifically, the invention is concerned with a method and circuitry for minimizing switching transients in a high-speed telecommunications system by aligning the phase of a primary stratum clock with the phase of a back-up or standby clock prior to switching operational use from the primary clock to the standby clock.

BACKGROUND OF THE INVENTION

Purchasers of telecommunications systems are highly influenced by the reliability of these systems. In fact, for most users of high-speed telecommunications systems, high reliability is essential. Consequently, designers of telecommunications systems commonly use redundant components and circuits to increase the reliability of their systems. For example, if a fault develops in a critical portion of the system, then the redundant component or circuit automatically takes over the function of the faulty portion. Alternatively, and also by way of example, a user may switch an operation to a redundant component or circuit for maintenance purposes. Subsequently, the primary component or circuit may be replaced by a new part. In order to maximize maintainability and minimize fabrication costs, manufacturers of high-speed telecommunications systems typically provide interchangeable primary and redundant components or circuits.

In a known configuration, which will be described in detail below, a plurality of primary Stratum Clock modules and redundant, "hot standby" Stratum Clock modules are included in a high-speed telecommunications system. These Stratum Clock modules are used to provide clock pulses, free of jitter and wander, required to synchronize certain discrete, integrated circuits that make up the system. Typically, the primary and standby Stratum Clock modules are interchangeable as to both location and function, and may operate in a reversible master-slave configuration in which the master is the frequency reference for the slave. The master could be either tracking an external source or be operating in a free-running condition. For example, FIG. 1 shows two stratum synchronizers arranged in a typical master/slave configuration. If the quality of the primary clock's signals degrades significantly, or the operation of the primary clock is disrupted, then the system switches operational use over to the standby clock module. If deemed necessary, the user may then replace the defective module with a new module. Given the interchangeability of the primary and standby modules, and the current state of the technology, frequency errors between the primary and standby clock signals can be minimized. Therefore, by providing redundant stratum clock modules, the manufacturer ensures that the operability and reliability of the overall system is increased. However, although the frequencies of the primary and standby clock signals can be aligned to within an acceptable tolerance, a significant phase difference between the two signals can still exist. Consequently, when operations are switched from one clock module to another, if a phase difference between the two clock signals exists, a transient is generated along with the clock signal and propagated throughout the system. So, for a significant period of time after the switching operation, portions of the system could suffer from this phase transient, and the performance and reliability of the overall system would be degraded.

It is an object of the present invention, therefore, to provide a method and circuit that detects and measures a phase difference between the output signals from a primary Stratum Clock module and a standby Stratum Clock module in a telecommunications system, computes a period of time needed for a numerically-controlled oscillator to shift the frequency of the standby clock enough to cancel the phase difference, and generates the corresponding frequency step that is coupled to the numerically-controlled oscillator, which then operates to shift the frequency of the standby clock and thereby cancel the phase difference. Both the frequency and phase alignments of the two clocks are thus maintained. Therefore, when the system or user switches operations from the primary stratum clock module to the standby stratum clock module, phase-related transients are not generated, which results in a significant increase in the overall performance and reliability of the system. The present invention achieves this object with minimal additional circuitry.

In accordance with the invention, the following method and circuitry apply to synchronized stratum clock generators utilizing digital oscillators or numerically-controlled oscillators, and any type of central processing unit functioning as an integrator.

BRIEF DESCRIPTION OF THE DRAWINGS

Other objects and advantages are apparent and best understood by reference to the following description of illustrative embodiments when read in conjunction with the accompanying drawings, wherein.

DETAILED DESCRIPTION OF THE INVENTION

Figure 1:
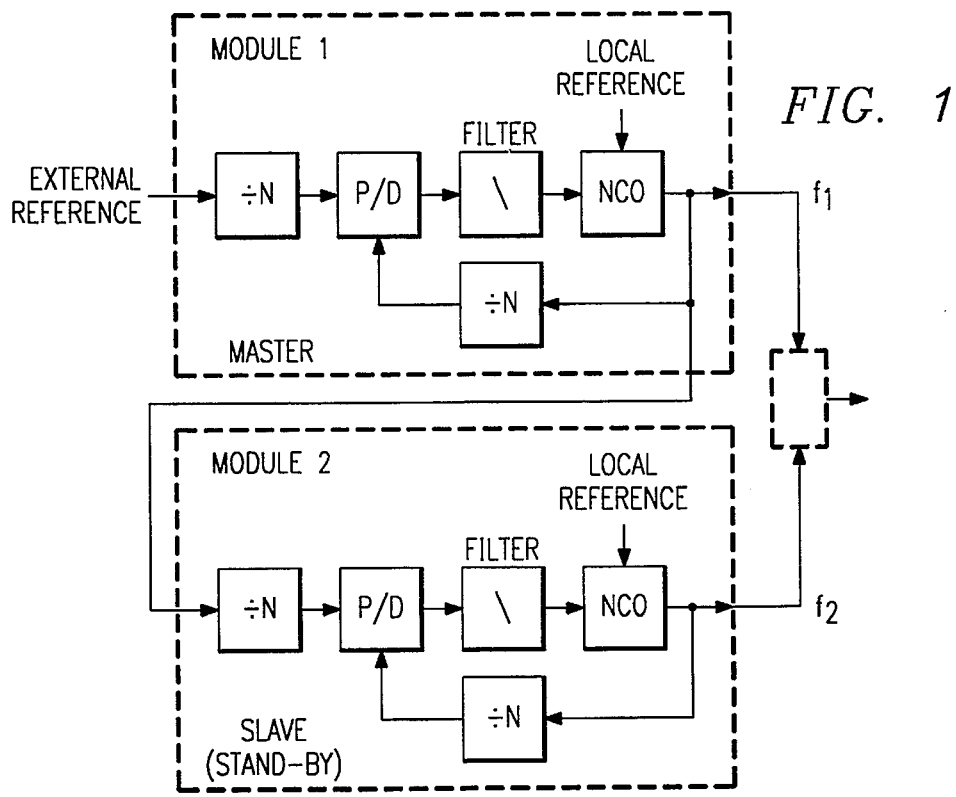
FIG. 1, shows a block diagram of two stratum clock synchronizers arranged in a typical master/slave configuration.
Figure 2:
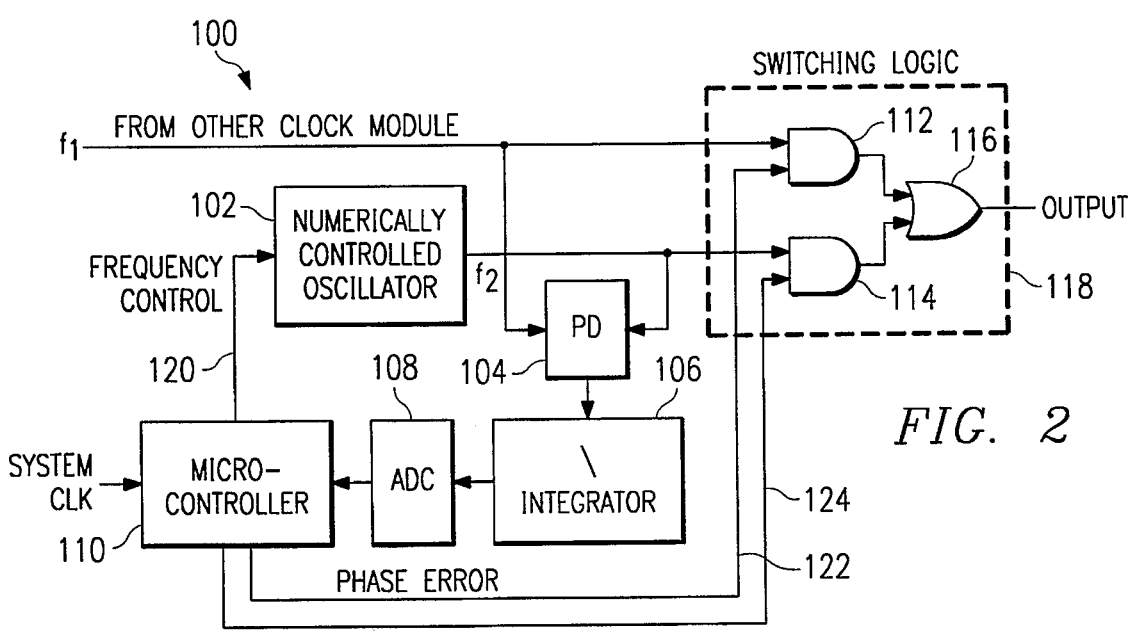
FIG. 2 shows a block diagram of the preferred embodiment.

In FIG. 2, stratum clock module 100 for a high-speed telecommunications system is shown that includes numerically-controlled oscillator (hereinafter "NCO") 102. It is understood that stratum clock module 100 may represent either a primary or standby stratum clock module, since the structure and operation of these modules are identical. Selection of a particular clock module to perform the function of either a primary module or standby module is determined by operating conditions. In a preferred embodiment, stratum clock module 100 is selected to function as a "hot standby" module (i.e., operating, but in a standby mode) and designated as the "slave". The primary module is thus designated as the "master". Generally, the clock output signal f2 from module 100 is generated by NCO 102, which is a highly accurate, temperature-independent, numerically-controlled oscillator having the required frequency resolution. NCO 102 may be a STEL 1173, which is manufactured by Stanford Telecomm. However, any known digital oscillator having similar functional capabilities may be substituted for NCO 102. The frequency of signal f2 is controlled by microcontroller 110, which may be a MC 68331 microcontroller that is manufactured by Motorola. However, the invention is not intended to be so limited and any known, high-speed digital controller or processor having similar functional capabilities may be substituted for microcontroller 110. Phase alignment is performed by temporarily shifting the frequency of the "slave" clock enough to cancel any existing phase error.

Specifically, clock signal output f2 from NCO 102 is coupled to an input connection of AND gate 114 and phase detector 104. Clock signal f1 from a primary stratum clock module (not explicitly shown), operating as the master module, is coupled to the other input connection of phase detector 104 and an input connection of AND gate 112. Phase detector 104 functions as a 360° digital phase detector to measure a phase difference between clock pulses f1 and f2. A first control output of microcontroller 110 is connected via line 124 to the second input connection of AND gate 114, and a second control output is connected via line 122 to the second input connection of AND gate 112. The outputs of AND gates 112 and 114 are coupled to respective input connections of OR gate 116. The output of OR gate 116 is coupled to cross-connect circuitry or other telecommunications equipment (not explicitly shown). By applying a control signal to either of AND gates 112 or 114, microcontroller 110 may select respective clock signal f1 or f2 to provide the clock signal output from module 100. The combination of AND gates 112 and 114, and OR gate 116 make up switching logic circuit 118. The output of phase detector 104 is connected to the input of integrator 106. The output of integrator 106 is connected to the input of A/D converter 108, and the output of A/D converter 108 is connected to a data input connection of microcontroller 110. A data output of microcontroller 110 is coupled via data line 120 to an input of NCO 102.

Operation

Having explained generally the structure and processes of the preferred embodiment, the following description shows how the preferred embodiment detects a phase difference between the primary and standby stratum clock signals, and shifts the standby clock signal frequency to negate any existing phase difference.

Initially, standby ("slave") stratum clock 100 is generating the same long-term frequency as that of the on-line or primary stratum clock (not explicitly shown). This frequency is represented for each stratum clock by a number, which is stored in a register of microcontroller 110. Before switching between stratum clocks is accomplished, the master and slave stratum clocks "freeze" their respective digital oscillators (NCO's) so that their respective frequencies are constant. Specifically, prior to switching over from the "master" module to standby stratum clock module 100, phase detector 104 detects any phase difference between signals f1 and f2, and outputs a corresponding difference signal to integrator 106. Since the difference signals that are output from digital phase detector 104 are varying at a rate approaching the clock frequency, the discrete difference signals are integrated over time by integrator 106 to provide an analog error voltage corresponding to an average value of the difference signals. The analog phase error voltage from integrator 106 is converted to a digital phase error signal by A/D converter 108, and coupled to a data input of microcontroller 110. Microcontroller 110 operates to calculate the amount of time that will be needed for NCO 102 to shift frequency f2 to thereby cancel the phase error. Microcontroller 110 then outputs corresponding frequency control instruction data via line 120 to NCO 102, which responds by shifting the frequency of signal f2 the appropriate length of time needed to cancel the phase error. The relationship between the frequency step required by NCO 102 to shift frequency f2 enough to cancel the phase error, and the phase shift $\phi$ as a function of time, is given by Equation 1 as follows:

$$\phi = (T_1 - T_2) f * t \qquad (1)$$

where
$T_1 = (T_{average}) = 1/f_1$,
$T_2 = (T_{average} + T_{change}) = (1/f_1 + 1/\Delta f)$,
f = the average frequency, and
t = the time during which the differential frequency must be applied. Microcontroller 110 monitors the phase error signal from A/D converter 108, and after making sure that the phase error is reduced below a predetermined threshold, controls switching logic 118 to select signal f2 as the output clock signal, if switching is required. Of course, since clock module 100 is operating in a "hot standby" mode prior to the switching operation, a steady state condition will have been reached by the time frequency f2 is selected and any phase difference existing between signals f1 and f2 will be minimal at the time of the switching operation.

Figure 3:
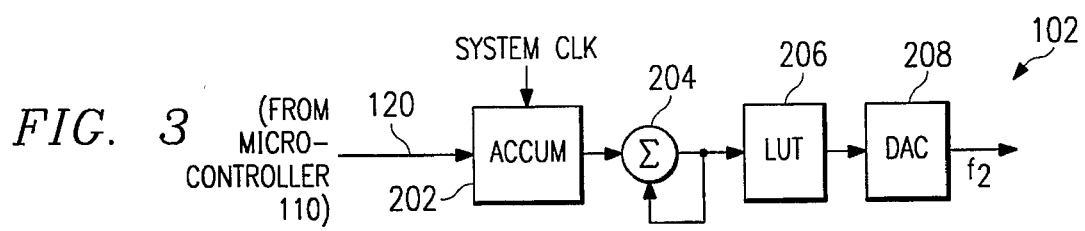
FIG. 3 shows a block diagram of the numerically-controlled oscillator depicted in FIG. 2.

FIG. 3 shows a block diagram of the numerically-controlled oscillator depicted in FIG. 2. Referring to FIGS. 2 and 3, NCO 102 includes register 202, which may function as a 48-bit accumulator. The size of register 202 determines the frequency resolution of NCO 102. Control data representing the new frequency information, $f+\Delta f$, required to cancel an existing phase error are coupled from microcontroller 110 via control line 120 and written into register 202. The read/write operations of register 202 are synchronized by the system clock. The shift data in register 202 are then read out to adder 204. The output signal from adder 204 is mapped into look-up table 206, which functions to convert the time data to the sine of a corresponding frequency. The output data from look-up table 206 are then coupled to D/A converter 208, which provides the corrected output signal at frequency f2. Accordingly, the phase error monitored by microcontroller 110 will be cancelled and the phase difference between frequencies f2 and f1 will be negated.

In summary, the invention provides a method and circuitry for detecting a phase difference between a primary stratum clock signal and a standby stratum clock signal used in a high-speed telecommunications system, calculating the time required to shift the output frequency of a numerically-controlled oscillator enough to negate the phase difference, operating the numerically-controlled oscillator accordingly to negate the phase difference, prior to switching operational use from the primary to the standby clock, and thereby minimizing phase-related transients during the switching operation to increase the operability and reliability of the overall system.

As a result of the above, although the invention has been described with reference to the above embodiments, its description is not meant to be construed in a limiting sense.

Various modifications of the disclosed embodiment, as well as alternative embodiments of the invention will become apparent to persons skilled in the art upon reference to the above description. It is therefore contemplated that the appended claims will cover such modifications that fall within the true scope of the invention.

What is claimed is:

1. A method for negating a phase difference between clock signals in a high-speed telecommunications system, comprising the steps of:

detecting the phase difference between a first clock signal and at least a second clock signal;

calculating at once, a total time required to shift a frequency of said first clock signal by an amount required to negate said phase difference completely; and shifting the frequency of said first clock signal in correspondence with said calculated total time.

2. A circuit for negating a phase difference between a plurality of clock signals in a high-speed telecommunications system, comprising:

a first circuit operable to detect a phase difference between a first clock signal and at least a second clock signal;

a second circuit associated with said first circuit and operable to generate a phase error corresponding to said detected phase difference; and a third circuit coupled to said second circuit, said third circuit operable to calculate at once, a total time required to shift a frequency of said first clock signal to negate said phase difference completely and, responsive to said calculation, thereby cancelling said phase error.

3. A method for aligning a phase of a plurality of high-speed frequency-synchronous clock signals, comprising the steps of:

detecting the phase of a first high-speed clock signal and at least a second high-speed clock signal;

generating an error signal corresponding to a phase difference between said first clock signal and said at least second clock signal;

calculating at once, a total time required to shift a frequency of said first clock signal by an amount required to cancel the error signal completely;

converting the calculated total time to corresponding frequency; and generating said first clock signal at corresponding frequency.

4. A circuit for aligning a phase of a plurality of high-speed frequency-synchronous clock signals, comprising:

a clock generator circuit operable to generate a first high-speed clock signal;

a first circuit operable to detect the phase of said first high-speed clock signal and at least a second high-speed clock signal;

a second circuit coupled to said first circuit and operable to generate an error signal corresponding to a phase difference between said first clock signal and said at least second clock signal;

a third circuit operable to receive said error signal and calculate at once, a total time required to shift a frequency of said first clock signal by an amount required to cancel the error signal completely;

a fourth circuit associated with said third circuit and operable to convert the calculated total time to a corresponding frequency; and a fifth circuit operable to control the clock generator so as to generate the corresponding frequency.

* * * * *